United States Patent [19]
Matsumoto et al.

[11] 4,326,295
[45] Apr. 20, 1982

[54] TELEVISION TUNER CIRCUIT

[75] Inventors: Tomomi Matsumoto, Yokohama; Kiyoshi Amemiya, Takayama; Yukitomi Kanai, Katsuta, all of Japan

[73] Assignee: Hitachi, Ltd., Tokyo, Japan

[21] Appl. No.: 41,893

[22] Filed: May 24, 1979

[30] Foreign Application Priority Data

May 29, 1978 [JP] Japan .................................. 53-63333

[51] Int. Cl.³ .......................... H04N 5/44; H04B 1/16
[52] U.S. Cl. ..................................... 455/188; 455/176; 455/180
[58] Field of Search ............... 325/458, 460, 461, 462, 325/468, 492; 334/11, 12, 14, 15; 358/190, 191; 455/188, 189, 190, 191, 168, 169, 176, 180

[56] References Cited

U.S. PATENT DOCUMENTS

| | | | |
|---|---|---|---|
| 3,564,423 | 2/1971 | Putzer | 325/458 |
| 3,678,421 | 7/1972 | Ono | 334/14 |
| 3,727,140 | 4/1973 | Rodrigalvarex Nieto | 325/458 |
| 4,000,470 | 12/1976 | Okada | 325/460 |
| 4,118,679 | 10/1978 | Hiday et al. | 325/461 |

*Primary Examiner*—Jin F. Ng
*Assistant Examiner*—Tommy P. Chin
*Attorney, Agent, or Firm*—Craig and Antonelli

[57] ABSTRACT

A television tuner comprises a VHF tuner section and a UHF tuner section and is configured in the two tuned modes of VHF high band and VHF low band between which the input tuning circuit of the VHF tuner section is switched by a diode in response to a source voltage. The television tuner further comprises a bias circuit for biasing said band-switching diode in reverse or forward direction by use of the UHF band source voltage during the receipt of UHF band.

8 Claims, 6 Drawing Figures

4,326,295

TELEVISION TUNER CIRCUIT

BACKGROUND OF THE INVENTION

1. Field of the Invention

The present invention relates to a television tuner circuit having VHF and UHF tuner sections.

2. Description of the Prior Art

A certain tuner circuit for television uses a band switching diode for switching the low and high bands of the VHF tuner section.

For selecting the VHF low band, the band switching diode is turned off so that the input tuning circuit enters a VHF low band receiving mode. For selection of the VHF high band, on the other hand, the band switching diode is turned on so that the input tuning circuit is placed in the VHF high band receiving mode. Further, for selection of UHF, the band switching diode is subjected to zero bias mode.

This tuner circuit has the advantage that the band-switching diode is operated, i.e., the band is switched with a single-polarity power supply.

If the band switching diode is placed in the zero bias mode for selection of the UHF band in the VHF or UHF tuner circuit, however, the VHF component of a large signal higher than 1 V reaching the VHF antenna input tuner circuit is applied to the band switching diode, with the result that the band switching diode generates a high harmonic or snow noise attributable to the non-linear rise characteristics of the diode. This component is radiated on the UHF antenna input tuner circuit of the UHF tuner section, thereby deteriorating the S/N ratio of the UHF signal, resulting in the lower quality of the picture.

In order to solve this problem, the conventional tuner circuits use a power supply of two polarities, positive and negative, for controlling the band-switching diode. During the receipt of the VHF low band, the band-switching diode is turned off by the positive power supply; during the receipt of the VHF high band, the band-switching diode is turned on with the positive power supply; and during the receipt of the UHF band, the band-switching diode is impressed with a reverse bias from the negative power supply, thus preventing the diode from generating any high harmonic or snow noises.

The conventional methods are unsatisfactory both technically and in cost since the band switching operation requires a power supply of two polarities, positive and negative, and the number of required power terminals of the tuner is increased, thus complicating the circuit configuration.

SUMMARY OF THE INVENTION

Accordingly, it is an object of the present invention to provide a simple and low-cost television tuner circuit which is capable of band-switching operation with a single-polarity power supply for producing a UHF picture without any interference.

The feature of the circuit configuration according to the present invention lies in that during the UHF band receipt a single-polarity source voltage for driving the tuner section is used to apply a forward or reverse bias to the VHF low-high band switching diode of the VHF tuner section.

According to one aspect of the present invention, a proper bias voltage is applied to the band-switching diodes of the VHF tuner section during the receipt of the UHF band, and therefore high harmonics or snow noises are prevented from being generated from the band-switching diodes even when an electric wave of large amplitude arrives at the VHF tuner section, thus producing a clear UHF image without any interference.

According to another aspect of the present invention, each band is selected with a single-polarity power supply so that the tuner circuit according to the present invention is satisfactory both technically and in cost.

DESCRIPTION OF THE PREFERRED EMBODIMENTS

Figure 1:
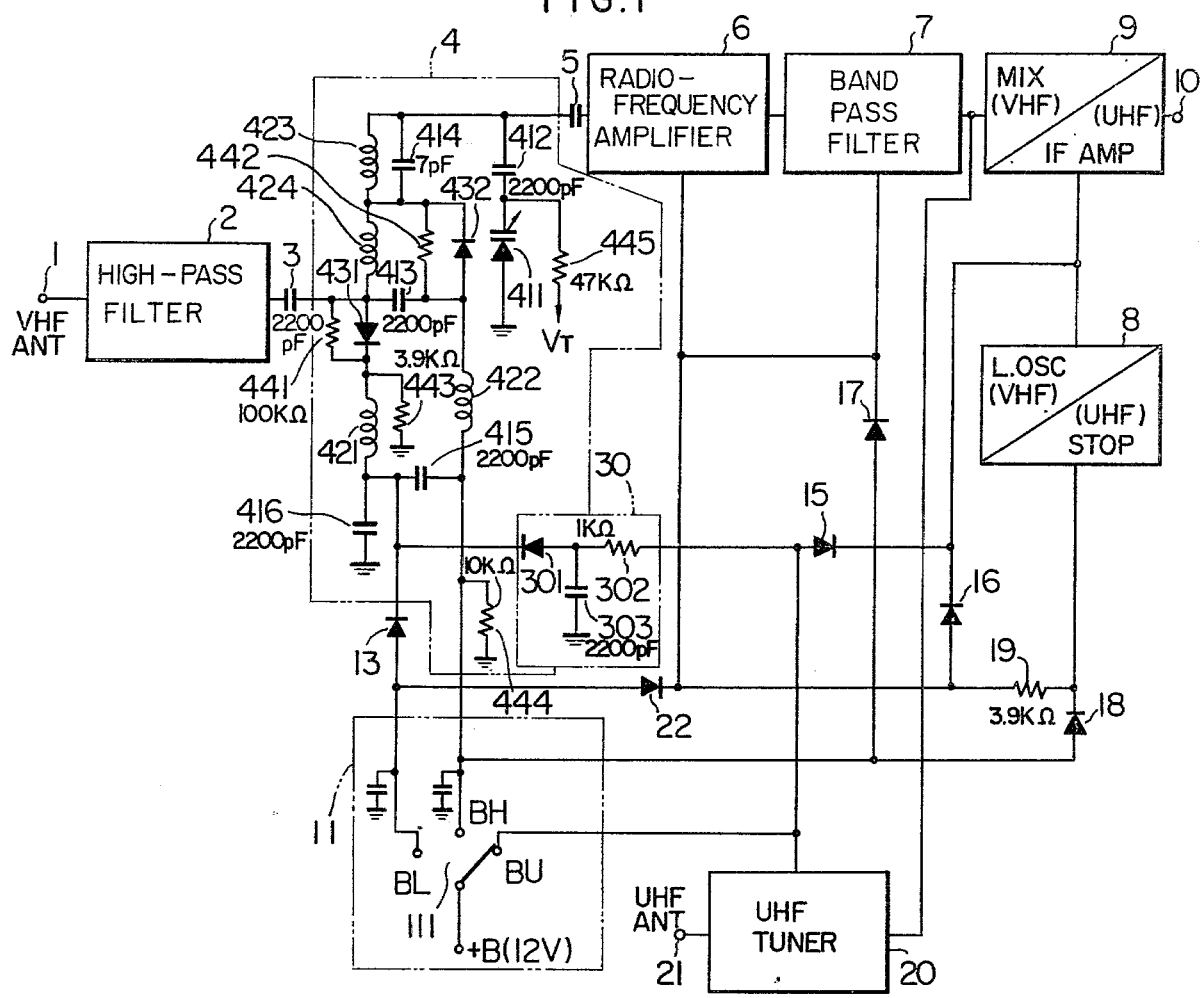
FIG. 1 is a wiring diagram showing a tuner circuit according to an embodiment of the present invention.

Embodiments of the present invention will be described below with reference to the attached drawings. A wiring diagram of the tuner circuit according to an embodiment of the present invention is shown in FIG. 1. Reference numeral 1 shows a VHF antenna terminal, numeral 2 a high-pass filter, numeral 3 a coupling capacitor, and numeral 4 an input tuner circuit. The input tuner circuit comprises a tuning capacitor circuit including a variable capacitance diode 411 and a tracking correction capacitor 412; a tuning inductor circuit including a VHF high-band tuning coil 421 and a VHF low-band tuning coil 422; and a band-switching circuit including VHF high-low band switching diodes 431 and 432 for switching the coils 421 and 422 of the tuning inductor circuit. The anode of the band-switching diode 431 is connected via the capacitor 3 to the filter 2 on the one hand and to the radio-frequency amplifier 6 via the capacitor 5 on the other hand. The cathode of the diode 431 is grounded through the coil 421 and the capacitor 416 on the one hand and grounded through the resistor 443 on the other hand. The anode of the band-switching diode 432 is connected to the anode of the diode 431 through the capacitor 413 on the one hand and grounded through the coil 422, and the capacitors 415 and 416 on the other hand. Further, the anode of the diode 432 is grounded through the coil 422 and the resistor 444. The cathode of the diode 432 is connected to the radio-frequency amplifier 6 through the coil 423 and capacitor 414 in parallel with each other and through the capacitor 5. The anode of the variable capacitance diode 411 is directly grounded, while the cathode thereof is connected to the radio-frequency amplifier 6 through the capacitors 412 and 5 on the one hand and to the tuning voltage source $V_T$ through the resistor 445 on the other hand. Numeral 7 shows a band pass filter, numeral 8 a local oscillator, and numeral 9 a mixer/intermediate frequency amplifier which operates as a mixer during the receipt of VHF band and as an intermediate frequency amplifier during the receipt of UHF band. Numeral 10 shows an intermediate frequency signal output terminal. These parts make up a generally-known VHF tuner section.

Numeral 20 shows a UHF tuner section and numeral 21 a UHF antenna terminal which are connected as shown. Numeral 30 shows a circuit means which leads the source voltage for driving the UHF tuner section 20 to the band-switching diodes 431 and 432 of the input tuner circuit 4 of the VHF tuner section. This circuit means is comprised of a diode 301, a resistor 302 and a capacitor 303. Numeral 11 shows a power supply device including a power change-over switch 111. The VHF low-band power supply terminal BL of the switch 111 is connected in DC fashion to the cathode of the band-switching diode 431 through the diode 13 and the coil 421 of the VHF input tuner circuit 4 on the one hand and to the cathode of the band-switching diode 432 through the diode 13, the coil 421, the resistor 441 and the coil 424 on the other hand. The terminal BL is also connected to the radio-frequency amplifier 6 and the band pass filter 7 through the diode 22 and, in addition, to the mixer/intermediate frequency amplifier 9 through the diodes 22 and 16. The terminal BL is furthermore connected to the local oscillator 8 through the diode 22 and resistor 19. The VHF high-band power supply terminal BH is connected in DC fashion to the anode of the band-switching diode 432 through the coil 422 on the one hand and to the anode of the band-switching diode 431 through the coil 422, the resistor 442 and the coil 424 on the other hand. The terminal BH is also connected through the diode 17 to the high-frequency amplifier 6 and the band pass filter 7 and in addition, to the local oscillator 8 through the diode 18. The terminal BH is further connected through the diode 18, resistor 19 and diode 16 to the mixer/intermediate frequency amplifier 9. The UHF band power supply terminal BU of the switch 111 is connected to the UHF tuner section 20 on the one hand and in DC fashion to the cathodes of the band-switching diodes 431 and 432 of the input tuner circuit 4 through the resistor 302 and the diode 301 of the circuit means 30 on the other hand. The terminal BU is furthermore connected to the mixer/intermediate frequency amplifier 9 via the diode 15. The movable terminal of the switch 111 is connected to the power supply +B (12 V).

Figure 2A:
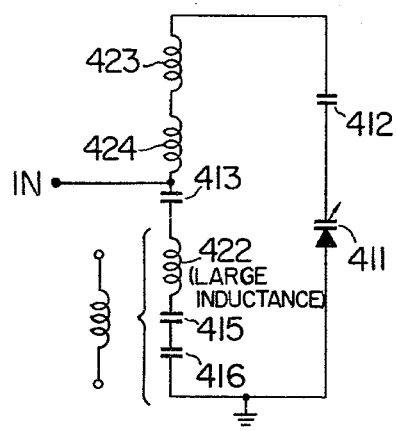
FIGS. 2A and 2B are diagrams showing equivalent circuits of the input tuner circuit included in FIG. 1.

In this circuit configuration, assume that the power +B is selectively applied to the VHF low-band power supply terminal BL. The source voltage is applied through the diode 13 to the cathodes of the band-switching diodes 431 and 432 of the input tuner circuit 4, so that the diodes 431 and 432 are turned off by being reversely biased by the source voltage. Upon the turning off of the band-switching diodes 431 and 432, the input tuner circuit 4 makes up a low-band tuning circuit as shown in FIG. 2A and is ready to receive the VHF low band frequency.

Figure 2B:
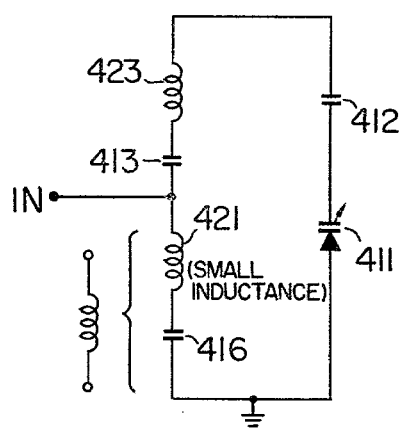

When the power +B is applied selectively to the VHF high-band power supply terminal BH, on the other hand, the source voltage is applied to the anode of the band-switching diodes 431 and 432 of the input tuner circuit 4, so that the diodes 431 and 432 are biased in forward direction by the source voltage and turned on. Upon the turning on of the band-switching diodes 431 and 432, the coil 422 of the input tuner circuit 4 is shorted by the diode 431, with the result that a high-band tuning circuit as shown in FIG. 2B is configured, thus making the circuit ready to receive the VHF high band.

When the power supply +B is supplied to the UHF band power supply terminal BU, the UHF band source voltage is applied through the resistor 302 and the diode 301 of the circuit means 30 to the cathodes of the band-switching diodes 431 and 432 of the input tuner circuit 4 of the VHF tuner section, thus turning off the diodes 431 and 432 by being reversely biased by the source voltage. By selecting appropriate values of the resistors 431, 432, 433 and 434 of the input tuning circuit 4, the reverse bias voltage to the band-switching diodes 431 and 432 is adjusted as desired.

In this way, an appropriate bias is applied to the band-switching diodes 431 and 432 of the input tuning circuit 4 of the VHF tuner section by use of the power supply +B supplied to the UHF band power supply terminal BU. Therefore, even if a VHF component of a large amplitude reaches the band-switching diodes 431 and 432 of the VHF tuner section at the time of UHF band receipt, an interference signal interfering with the UHF band receipt is prevented from being generated.

Figure 3:
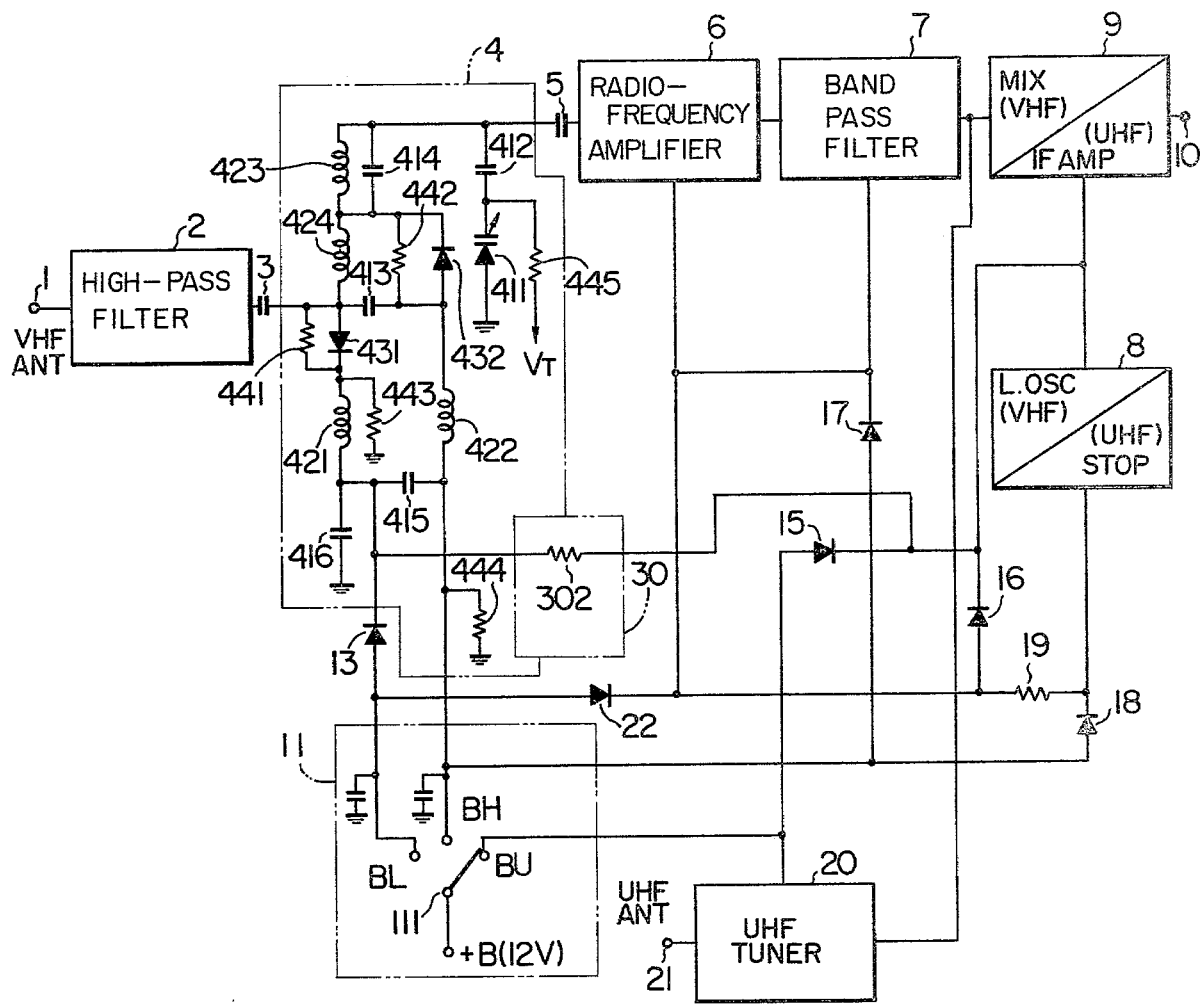
FIGS. 3, 4 and 5 are wiring diagrams showing tuner circuits according to other embodiments of the present invention.

In the above-mentioned embodiment, the voltage applied to the UHF band power supply terminal BU of the power supply device 11 is introduced to the band-switching diodes 431 and 432 of the input tuner circuit 4, so that the diodes 431 and 432 are reversely biased by the same voltage. As an alternative shown in FIG. 3, the input of the circuit means 30 may be connected to the mixer/intermediate frequency amplifier 9 so that the band-switching diodes 431 and 432 may be biased in reverse direction by utilizing the voltage of the mixer-/intermediate frequency amplifier 9.

Figure 4:
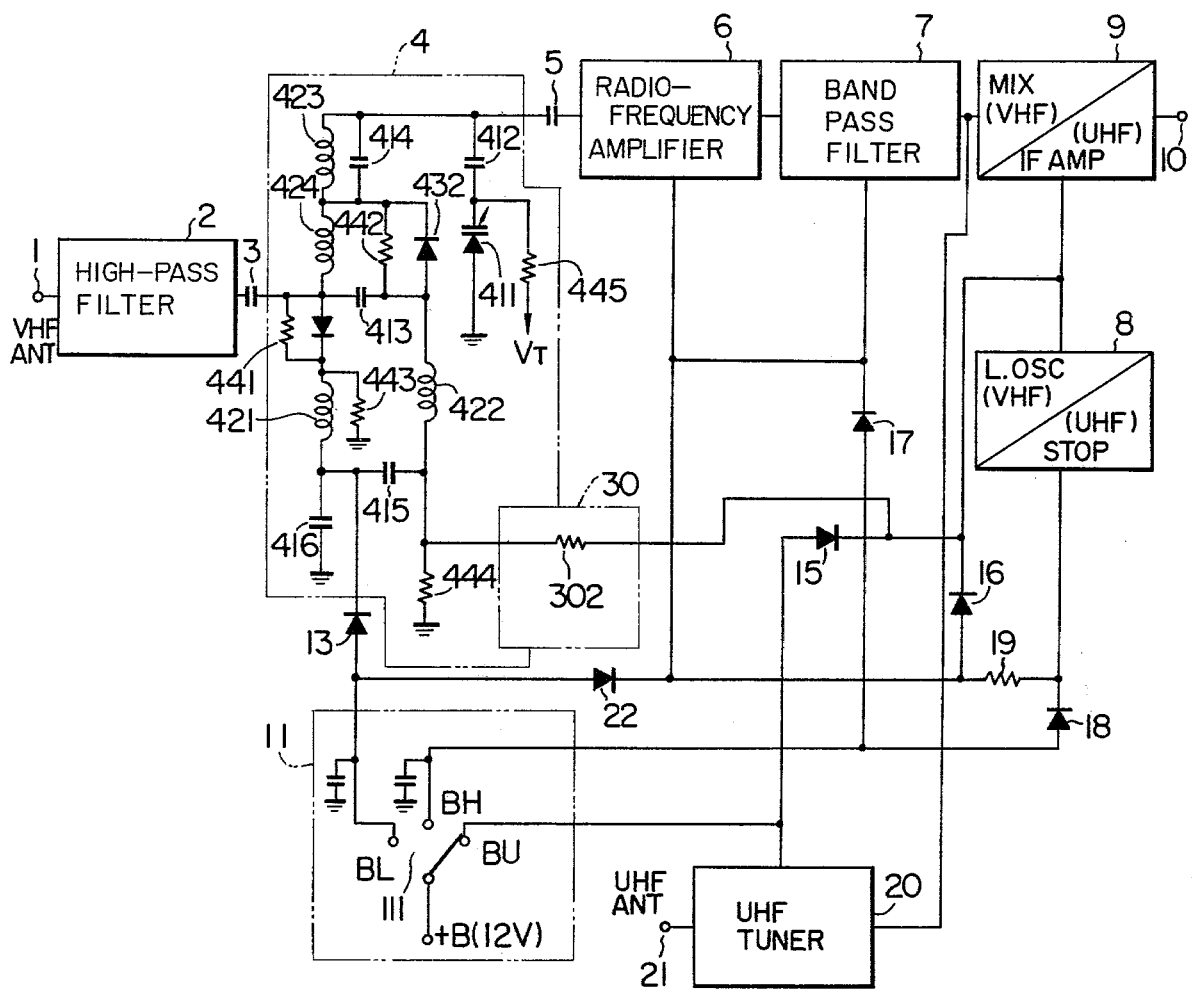

In the above-mentioned embodiment, a reverse bias voltage is applied to the band-switching diodes 431 and 432 of the input tuning circuit 4 of the VHF tuner section. This may be replaced with equal effect by the circuit configuration shown in FIG. 4. In other words, the VHF high-band power supply terminal BH of the power supply device is connected through the diode 17 to the high-frequency amplifier 6 and the band pass filter 7 on the one hand and to the local oscillator 8 through the diode 18 on the other hand. The terminal BH is also connected to the mixer/intermediate frequency amplifier 9 through the diode 18, resistor 19 and diode 16. The UHF band power supply terminal BU is connected through the diode 15 to the mixer/intermediate frequency amplifier 9 on the one hand and through the diode 15 and the resistor 302 of the circuit means 30 to the junction point of the resistor 444 and the coil 422 of the input tuning circuit 4 on the other hand. The other component parts are connected in the same manner as in FIG. 1. In this way, during the receipt of the UHF band, a forward bias may be applied to the band-switching diodes 431 and 432 by the UHF band source voltage thereby to dampen the high harmonics and snow noise which otherwise might be generated by the zero biasing of the band switching diodes.

Figure 5:
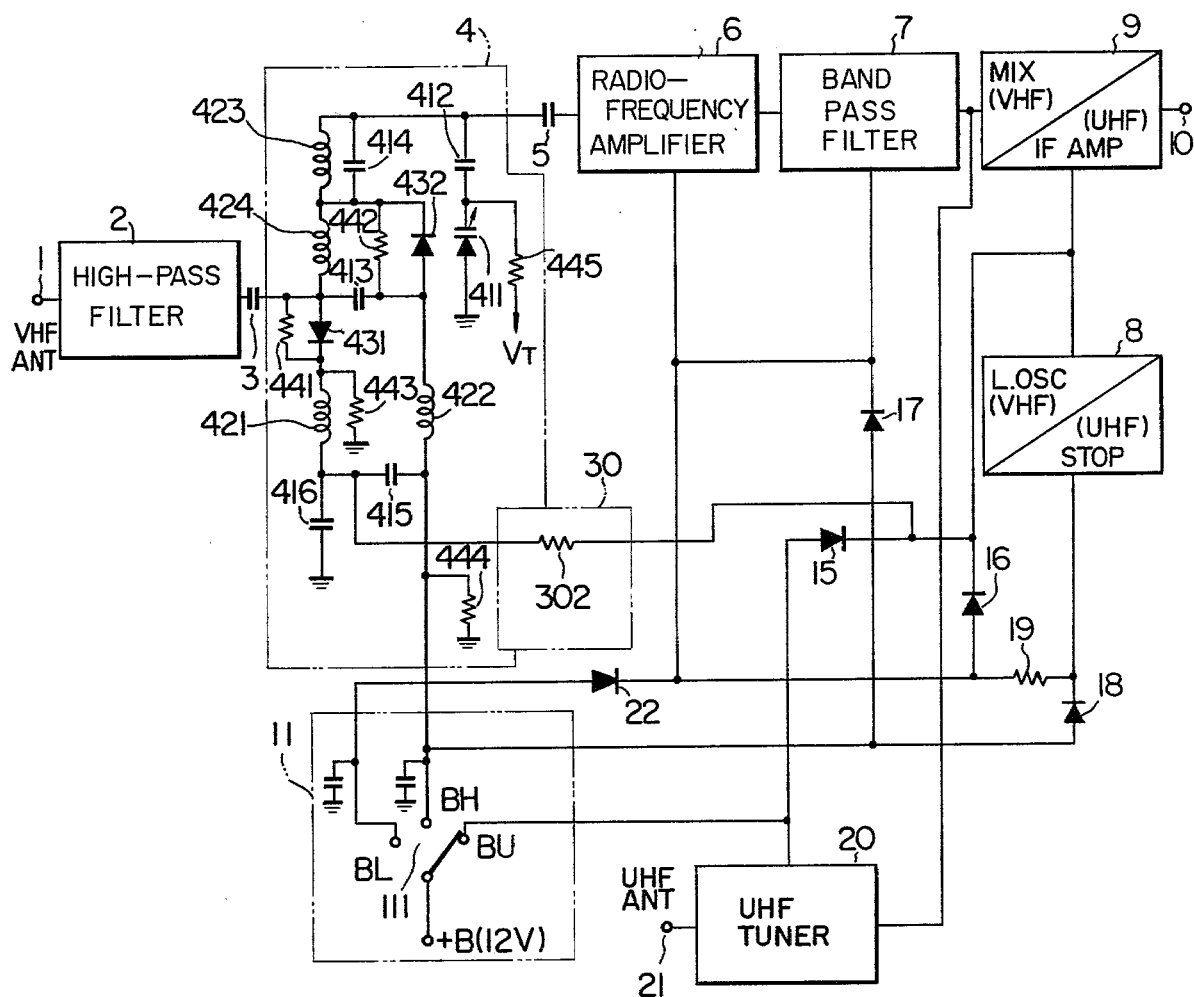

A circuit diagram of a further embodiment of the present invention is shown in FIG. 5. In this drawing, component elements identical to those in FIG. 1 are designated by the same reference numerals and will not be described in detail. In FIG. 5, the VHF low-band power supply terminal BL of the power supply device 11 is connected through the diodes 22 and 16 to the mixer 9 on the one hand and through the diode 22 and resistor 19 to the local oscillator 8 on the other hand. The VHF high-band power supply terminal BH is connected through the coil 422 of the input tuning circuit 4 to the band-switching diode 432 on the one hand and through the coil 422, resistor 442 and coil 424 to the band-switching diode 432 on the other hand. The terminal BH is also connected to the high-frequency amplifier 6 and the band filter 7 via the diode 17, to the local oscillator 8 through the diode 18, and further to the mixer/intermediate frequency amplifier 9 through the diode 18, the resistor 19 and the diode 16. The UHF band power supply terminal BU is connected via the diode 15 to the mixer/intermediate frequency amplifier 9 on the one hand and in DC fashion to the cathodes of the band-switching diodes 431 and 432 of the input tuning circuit 4 through the diode 15 and the resistor 302 of the circuit means 300 on the other hand.

In the circuit configuration according to the embodiment under consideration, the UHF band power supply terminal BU is connected to the cathodes of the band-switching diodes 431 and 432 of the input tuning circuit 4 through the resistor 302 of the circuit means 30 and the diode 15, so that the diodes are biased in reverse direction. As noted from the drawing, this circuit configuration is simpler than that of FIG. 1.

It will be seen from the foregoing description that according to the present invention, by use of the source voltage of single polarity (positive) of the tuner section during UHF band receipt, the band-switching diodes of the input tuning circuit 4 of the VHF tuner section are impressed with a bias voltage, thereby preventing the high harmonics or snow noise from being generated from the diodes, resulting in a clear UHF image at low cost.

We claim:

1. In a television tuner comprising a VHF tuner section, a UHF tuner section and a power supply device connected to said VHF and UHF tuner sections for selectively supplying the same with a single-polarity DC power as a power supply for VHF low band, VHF high band and UHF band, said VHF tuner section including an input tuning circuit which in turn includes band-switching diodes for switching a low-band tuning element and a high-band tuning element for determining the tuning band of said input tuning circuit, said diodes being subjected to on-off switching by said power supply for VHF low-band and VHF high band of said power supply device, thereby switching said input tuning circuit between two tuned modes of VHF low band and VHF high band;

a television tuner circuit including circuit means for connecting said power supply device to said band-switching diodes of said input tuning circuit of said VHF tuner section, said power supply being introduced to said diodes when the UHF band power is selectively supplied to said UHF tuner section from said power supply device, said power supply device including a VHF low-band and VHF high-band power supply terminal connected to said VHF tuner section and a UHF band power supply terminal connected to said UHF tuner section, said circuit means including a first bias circuit for connecting said UHF band power supply terminal to a mixer/intermediate frequency amplifier common to said VHF and UHF tuner sections and a second bias circuit for connecting said mixer/intermediate frequency amplifier in DC fashion to said band-switching diodes of said input tuning circuit of said VHF tuner section, said second bias circuit introducing the DC voltage generated in said mixer/intermediate frequency amplifier to said diodes when said single-polarity DC power is supplied to said UHF band power supply terminal during the receipt of UHF band, thereby biasing said diodes.

2. In a television tuner comprising a VHF tuner section and a UHF tuner section, said VHF tuner section including an input tuning circuit which in turn includes VHF low-band and a VHF high-band tuning inductor elements for determining the tuning band of said tuning circuit, and band-switching diodes for switching said input tuning circuit between the two tuned modes of VHF low-band and VHF high-band;

a television tuner circuit comprising a power supply device connected to said VHF tuner section and said UHF tuner section and including a VHF low-band power supply terminal, a VHF high-band power supply terminal, a UHF band power supply terminal and a source of single-polarity DC power, said power supply device supplying said DC power to said VHF tuner section and said UHF tuner section through said terminals;

first circuit means for connecting said VHF low-band power supply terminal of said power supply device in DC fashion to said band-switching diodes of said input tuning circuit of said VHF tuner section to switch said diodes to one mode of on and off modes of operation when said single-polarity DC power is supplied to said VHF low-band power supply terminal, thereby placing said input tuning circuit in a VHF low-band mode;

second circuit means for connecting said VHF high-band power supply terminal of said power supply device in DC fashion to said band-switching diodes to switch said diodes to the other mode of said on and off modes of operation when said single-polarity DC power is supplied to said VHF high-band power supply terminal, thereby placing said input tuning circuit in a VHF high-band mode; and third circuit means for connecting said UHF band power supply terminal of said power supply device in DC fashion to said band-switching diodes when said single-polarity DC power is supplied to said UHF band power supply terminal, thereby biasing said diodes with said DC power.

3. A television tuner circuit according to claim 2, in which said third circuit means includes a bias circuit for connecting said UHF band power supply terminal of said power supply device in DC fashion to the cathodes of said band-switching diodes of said input tuning circuit, said bias circuit introducing said DC power to said diodes when said DC power is supplied to said terminal during the receipt of UHF band, thereby biasing said diodes in a reverse direction.

4. A television tuner circuit according to claim 2, in which said third circuit means includes a bias circuit for connecting said UHF band power supply terminal of said power supply device in DC fashion to the anodes of said band-switching diodes of said input tuning circuit, said bias circuit introducing said DC power to said diodes when said DC power is supplied to said terminal during the receipt of UHF band, thereby biasing said diodes in a forward direction.

5. A television tuner comprising:

a UHF tuner section;

a VHF tuner section having an input tuning circuit which in turn includes a VHF low-band tuning inductor element for causing said input tuning circuit to tune to a VHF low-band mode when connected in the input tuning circuit, a VHF high-band tuning inductor element for causing said input tuning circuit to tune to a VHF high-band mode when connected in the input tuning circuit, band switching diodes connected to said inductor elements, and circuit means having first and second control input terminals for rendering each said switching diode in a first state which corresponds to one state of on and off states thereof respectively when said first control input terminal is supplied with a single-polarity DC power so as to connect said VHF low-band inductor element in said input tuning circuit and for rendering each said switching diode in a second state which corresponds to the other state of said on and off states thereof respectively when said second control input terminal is supplied with the single-polarity DC power so as to connect said VHF high-band inductor element in said input tuning circuit;

a power supply device including a source of the single polarity DC power, and selector means for selectively supplying said DC power to a selected one of said first and second control input terminals and of the UHF tuner section in DC fashion; and supply means for connecting said DC power supply source to one of said first and second control input terminals in DC fashion when said selector means supplies the DC power to said UHF tuner section, and for disconnecting said DC power source to the UHF tuner section when said selector means supplies the DC power to said selected one of the first and second control input terminals.

6. A television tuner comprising:

a VHF tuner section and a UHF tuner section, said VHF tuner section including an input tuning circuit which in turn includes a VHF low-band and a VHF high-band tuning inductor elements for determining the tuning of either one of VHF low or high bands of said tuning circuit, first and second control terminals and band switching diodes each operatively rendered into one state of on and off states thereof for selectively connecting said VHF low-band tuning inductor element in said input tuning circuit as the tuning band determining element when a single-polarity DC power is supplied to said first control terminal and operatively rendered into the other state of said on and off states thereof for selectively connecting said high-band tuning inductor element in said input tuning circuit as the tuning band determining element when the single-polarity DC power is supplied to said second control terminal;

a tuner control circuit including a power supply device which in turn includes a VHF low-band power supply terminal, a VHF high-band power supply terminal, a UHF band power supply terminal, a source of single-polarity DC power and a selector for selectively connecting said DC power source to any one of said power supply terminals;

first circuit means for connecting said VHF low-band power supply terminal in DC fashion to said first control terminal so as to supply said DC power to said first control terminal when said VHF low-band power supply terminal is selectively connected to the DC power source;

second circuit means for connecting said VHF high-band power supply terminal in DC fashion to said second control terminal so as to supply said DC power to said second control terminal when said VHF high-band power supply terminal is selectively connected to the DC power source;

third circuit means for connecting said UHF band power supply terminal in DC fashion to said UHF tuner section; and fourth circuit means for connecting said UHF band power supply terminal to selected one of said first and second control terminals in DC fashion when said UHF band power supply terminal is selectively connected to said DC power source and for disconnecting said selected one of said first and second control terminals to said UHF tuner section in DC fashion when said selected one of the first and second control terminals is supplied with the DC power.

7. In a television tuner comprising a VHF tuner section, a UHF tuner section and a power supply device connected to said VHF and UHF tuner sections for selectively supplying the same with a single-polarity DC power as a power supply for VHF low band, VHF high band and UHF band, said VHF tuner section including an input tuning circuit which in turn includes at least one band-switching diode for determining the tuning band of said input tuning circuit, said diode being subjected to on-off switching by said power supply during the switching of said input tuning circuit between two tuned modes of VHF low band and VHF high band;

a television tuner circuit including circuit means for connecting said power supply device to said band-switching diode of said input tuning circuit of said VHF tuner section when the UHF band power is selectively supplied to said UHF tuner section from said power supply device, said power supply device including a VHF low-band and VHF high-band power supply terminal connected to said VHF tuner section and a UHF band power supply terminal connected to said UHF tuner section, said circuit means including a first bias circuit for connecting said UHF band power supply terminal to a mixer/intermediate frequency amplifier common to said VHF and UHF tuner sections and a second bias circuit for connecting said mixer/intermediate frequency amplifier in DC fashion to said band-switching diode of said input tuning circuit of said VHF tuner section, said second bias circuit including means for introducing the DC voltage generated in said mixer/intermediate frequency amplifier to said diode when said single-polarity DC power is supplied to said UHF band power supply terminal during the receipt of UHF band, thereby biasing said diode.

8. In a television tuner comprising a VHF tuner section and a UHF tuner section, said VHF tuner section including an input tuning circuit which in turn includes a VHF low-band and a VHF high-band tuning inductor elements for determining the tuning band of said tuning circuit, and means including at least one band-switching diode for switching said input tuning circuit between the two tuned modes of VHF low-band and VHF high-band;

a television tuner circuit comprising a power supply device connected to said VHF tuner section and said UHF tuner section and including a VHF low-band power supply terminal, a VHF high-band power supply terminal, a UHF band power supply terminal and a source of single-polarity DC power, said power supply device supplying said DC power to said VHF tuner section and said UHF tuner section through said terminals;

first circuit means for connecting said VHF low-band power supply terminal of said power supply device in DC fashion to said band-switching diode of said input tuning circuit of said VHF tuner section to switch said diode to one mode of on and off modes of operation when said single-polarity DC power is supplied to said VHF low-band power supply terminal;

second circuit means for connecting said VHF high-band power supply terminal of said power supply device in DC fashion to said band-switcing diode to switch said diode to the other mode of said on and off modes of operation when said single-polarity DC power is supplied to said VHF high-band power supply terminal; and third circuit means for connecting said UHF band power supply terminal of said power supply device in DC fashion to said band-switching diode when said single-polarity DC power is supplied to said UHF band power supply terminal, thereby biasing said diode with said DC power.

* * * * *